United States Patent [19]

Iijima et al.

[11] Patent Number: 5,007,057
[45] Date of Patent: Apr. 9, 1991

[54] POWER SOURCE MONITOR AND A ROTARY ENCODER WITH SUCH A MONITOR

[75] Inventors: Kenzaburou Iijima; Yoshinori Hayashi, both of Shizuoka, Japan

[73] Assignee: Yamaha Corporation, Japan

[21] Appl. No.: 298,501

[22] Filed: Jan. 18, 1989

[30] Foreign Application Priority Data

Jan. 18, 1988 [JP] Japan .................................. 63-7808

[51] Int. Cl.⁵ ............................................ G06F 11/10
[52] U.S. Cl. ........................................ 371/66; 341/15; 341/6; 371/49.1
[58] Field of Search ................. 371/3, 49.1, 66; 341/6, 341/9, 11, 13, 15

[56] References Cited

U.S. PATENT DOCUMENTS

| | | | |
|---|---|---|---|
| 4,551,841 | 11/1985 | Fujita et al. | 371/66 |
| 4,698,814 | 10/1987 | Verheul et al. | 371/49.1 |
| 4,766,567 | 8/1988 | Kato | 364/900 |
| 4,777,626 | 10/1988 | Matsushita et al. | 365/226 |

*Primary Examiner*—Charles E. Atkinson
*Attorney, Agent, or Firm*—Ostrolenk, Faber, Gerb & Soffen

[57] ABSTRACT

A rotary encoder which serves to generate absolute position data is outfitted with a power source monitor which generates, during a power interruption, an alarm signal which invalidates all subsequent absolute position data being outputted by the rotary encoder. Loss of output data from the rotary encoder is reliably prevented, even upon the unexpected occurrence of very short power supply interruptions. This enhances the operational reliability and stability of the encoder considerably.

4 Claims, 2 Drawing Sheets

POWER SOURCE MONITOR AND A ROTARY ENCODER WITH SUCH A MONITOR

BACKGROUND OF THE INVENTION

The present invention relates to a power source monitor and a rotary encoder with such a monitor, and more particularly relates to a monitor for detecting an interruption in the power supply to a rotary encoder incorporated in a machine such as an industrial robot.

In the case of an industrial machine equipped with a rotary encoder for displacement control, long interruption in the power supply can be easily detected and, based on such reliable detection, various countermeasures can be utilized to prevent the destruction of the output data from the rotary encoder.

In the case of a short interruption, in particular momentary interruption, it is nearly impossible to detect the interruption and to instantly react to prevent incorrect data from being generated by the rotary encoder. This seriously reduces the functional safety and reliability of the machine backed up by the rotary encoder.

SUMMARY OF THE INVENTION

It is the purpose of the present invention to reliably prevent incorrect data from being generated by rotary encoder against short period interceptions in power supply.

In accordance with the basic aspect of the present invention, a power source monitor is attached to a rotary encoder in order to pass an alarm signal to the encoder at the occurrence of an interruption in power supply so that all absolute position data subsequently issued by the encoder is rendered invalid.

DESCRIPTION OF THE PREFERRED EMBODIMENTS

Figure 1:
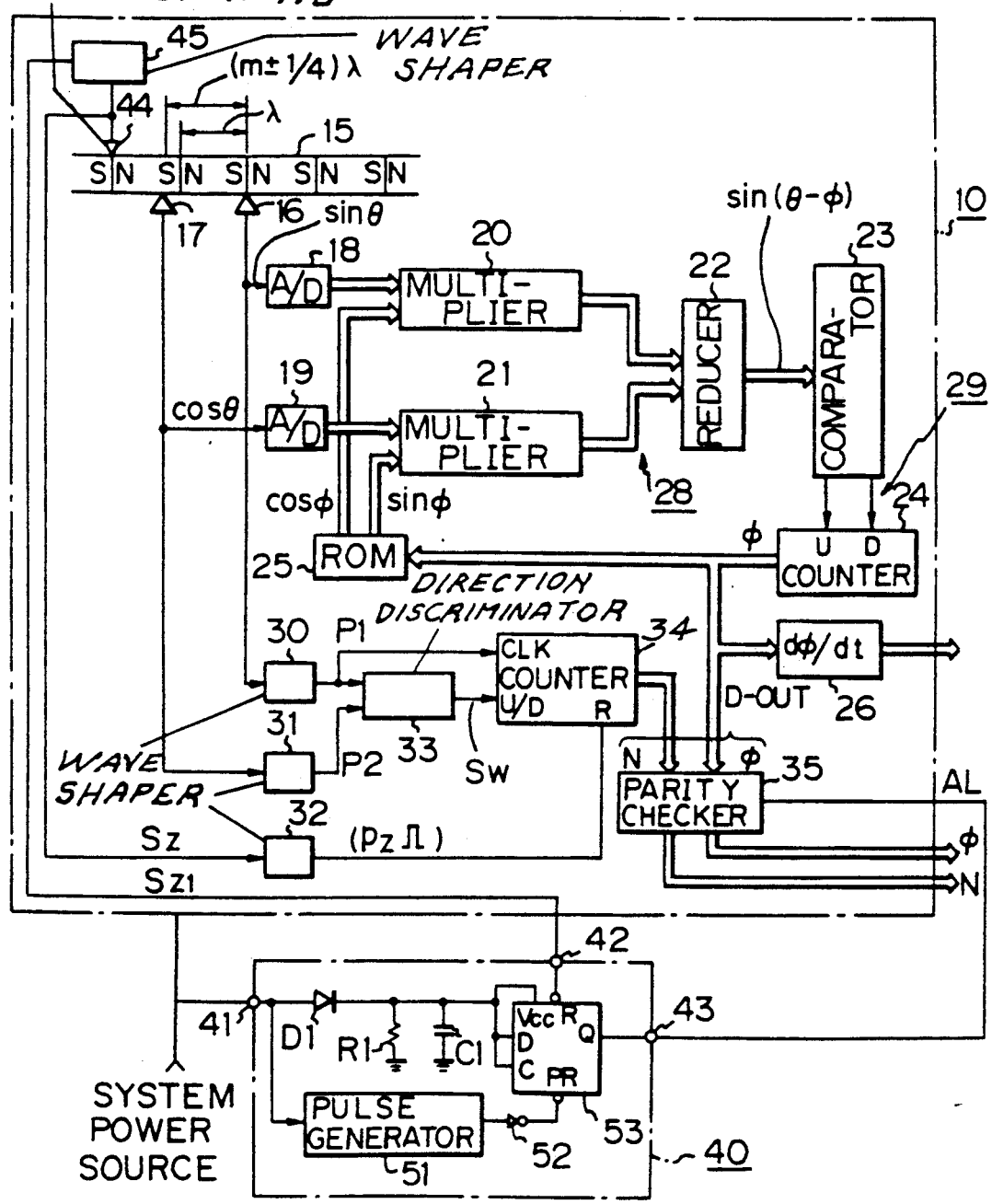
FIG. 1 is a block diagram of a rotary encoder equipped with one embodiment of the power source monitor in accordance with the present invention.

A rotary encoder 10 shown in FIG. 1 is outfitted with a power source monitor 40 in accordance with the present invention. The rotary encoder 10 includes a magnetic scale 15 which is produced with magnetizing a elongated track by a sine wave of a constant period. In the case of the illustrated example, the magnetic scale 15 is formed on a circular track fixed on the peripheral surface of a magnetic disc. The wavelength $\lambda$ of the sine wave is chosen in a range from several tens to several hundreds $\mu$m. Facing the magnetic scale 15 are a pair of magnetic sensors 16 and 17 which generate signals having levels corresponding to intensity of magnetization on the magnetic scale 15. The outputs from the magnetic sensors 16 and 17 are out of phase by a distance of $\frac{1}{4} \lambda$ (90 degrees) in the longitudinal direction of the magnetic scale 15. To this end, the distance between the magnetic sensors 16 and 17 should be equal to $(m \pm \frac{1}{4})\lambda$ wherein m is a positive integer. The magnetic scale 15 and the magnetic sensors 16 and 17 move relative to one another. When the magnetic scale 15 rotates, the magnetic sensors 16 and 17 remain still. If the magnetic sensors 16 and 17 revolve around the magnetic scale 15, the scale 15 remains still.

From the foregoing arrangement, it will be well understood that the magnetic sensor 17 generates a cosine signal when the magnetic sensor 16 generates a sine signal. When the period of the magnetizing sine wave is equal to $\theta$ and $\theta$ varies from 0 to $2\pi$ radians, the magnetic sensors 16 and 17 generate $\sin \theta$ and $\cos \theta$ signals, respectively.

The magnetic sensors 16 and 17 are connected to respective A/D converters 18 and 19 which convert analog input signals into corresponding digital output signals. By their operations, digitalized $\sin \theta$ and $\cos \theta$ signals are applied to digital multipliers 20 and 21, respectively. Output signals from the multipliers 20 and 21 are applied to a common digital reducer 22 whose output signal $\sin(\theta - \Phi)$ is passed to a digital comparator 23. When the output signal $\sin(\theta - \Phi)$ is positive, an up-count signal is applied to the up input terminal U of counter 24. When the output signal is negative, a down-count signal is applied to down input terminal D of the counter 24. The counter 24 is an up-down counter having 8 to 10 bits.

The output terminal of counter 24 is connected to a function generating ROM which generates $\sin \Phi$ and $\cos \Phi$ signals depending on the count value $\Phi$ in the counter 24. More specifically, a series of $\sin \Phi$ and $\cos \Phi$ data are stored in the function generating ROM 25 for sequential read-out in accordance with count value $\Phi$ signals given by the counter 24. The $\cos \Phi$ signal is applied to the multiplier 20 and the $\sin \Phi$ signal is applied to the multiplier 21. It is clear that the count value $\Phi$ in the counter 24 changes depending on the value of the $\sin(\theta - \Phi)$ signal put out by the reducer 22. The multipliers 20 and 21 and the function generating ROM form a function generating unit 28 whereas the comparator 23 and the counter 24 form a counting unit 29. The count value $\Phi$ signal from the counter 24 is also applied to a signal speed detector 26 which differentiate the count value $\Phi$ signal with time t.

The $\sin \theta$ and $\cos \theta$ signals from the magnetic sensors 16 and 17 are also passed to wave shapers 30 and 31, respectively. Wave shaping is carried out using a prescribed threshold value and an input analog signal is converted to a two-value signal which assumes an H or L level. Output signals $P_1$ and $P_2$ from the wave shapers 30 and 31 are in the form of rectangular pulse signals with a $\pi/2$ phase difference. In the case of a positive relative displacement between the magnetic scale 15 and the magnetic sensors 16 and 17, the signal $P_1$ runs ahead. On the other hand, the signal $P_2$ runs ahead in the case of a negative displacement. These output signals $P_1$ and $P_2$ are supplied to a common direction discriminator 33 which detects the direction of displacement of the magnetic sensors 16 and 17. Detection is based on the state of the level of the signal $P_2$ at the instant the level of the signal $P_1$ rises.

An output signal Sw from the direction discriminator 33 is supplied to the shift input terminal U/D of an up-down counter 34. Another input terminal CLK of this counter 34 receives the output signal $P_1$ from the wave shaper 30. Thus, the counter 34 counts the signal $P_1$ at the input terminal CLK while shifting its mode of counting in response to the signal Sw at the input terminal U/D. In the case of the illustrated example, an up-count mode is employed for a positive displacement of the magnetic sensors 16 and 17 and a down-count mode for a negative displacement. At the end of each revolution during the relative displacement, a zero-point signal Sz is generated when the reference position on the magnetic scale 15 meets a zero-point detection head 44. This zero-point signal Sz is on one hand applied to a wave shaper 32 which converts it into a pulse signal which is then applied to a reset terminal R of the counter 34. As a result, the counter 34 is reset every time the magnetic sensors 16 and 17 arrive at the reference position on the magnetic scale 15. As a result, the fact that the count value N of the counter 34 corresponds to the number of magnetic domains on the magnetic scale 15 which have been passed by the magnetic sensors 16 and 17 during their travel from the reference to the current position.

The output signal N from the counter 34 and the output signal $\Phi$ from the counter 24 form an absolute position data D-OUT which is applied to a parity checker 35. The higher bits of this absolute position data are formed by the output signal N from the counter 34 and lower bits by the output signal $\Phi$ from the counter 24. At the parity checker 35, the total number of bits of value 1 in the absolute position data D-OUT is detected, and addition of parity bit is carried out depending on the result of the parity check. At this moment, an alarm signal AL generated by a later-described power source monitor 40 is applied to the parity checker 35. When the alarm signal AL is at the L-level, a regular parity bit is added to the absolute position data D-OUT which is supplied outside the system as valid data. When the alarm signal AL is at the H-level, a reverse parity bit is added to the absolute position data D-OUT which is detected as invalid during subsequent signal processing.

The rotary encoder 10 housing the above-described construction incorporates the below-described power source monitor 40. The power source monitor 40 has a power input terminal 41 connected to a given system power source for the rotary encoder 10. This input terminal 41 is connected to a pulse generator 51 which generates in a stationary state a positive pulse when the input level falls below a prescribed value. The output terminal of the pulse generator 51 is connected to an input terminal of an inverter 52. The input terminal 41 is also connected to the anode of a diode $D_1$ whose cathode is connected in parallel to a resistor $R_1$ and a capacitor $C_1$ both of which are grounded. The cathode of the diode $D_1$ is further connected to a power source terminal Vcc, a data input terminal D and a clock input terminal C of a D-type flip-flop 53. The flip-flop 53 is further provided with a reset input terminal R connected to a zero-point signal input terminal 42 and a preset input terminal PR connected to the inverter 52. The input terminal 42 is connected to a wave shaper 45 of the rotary encoder 10. This wave shaper 45 is connected to the above-described zero-point detection head 44 so that the zero-point signal Sz is shaped into signal $Sz_1$. The output terminal Q of the flip-flop 53 is connected to an output terminal 43 to generate the alarm signal AL to be supplied to the parity checker 35 of the rotary encoder 10.

The power source monitor 40 of the above-described construction operates as follows.

When a positive relative displacement occurs between the magnetic scale 15 and the magnetic sensor 16 and 17, the counter 34 counts in the up-mode every time the magnetic sensors 16 and 17 pass by one magnetic domain on the magnetic scale 15, and the count value N is outputted to form the higher, more significant bits of the absolute position data D-OUT. The higher bits of the absolute position data D-OUT indicate the total number of the magnetic domains already passed by the magnetic sensors 16 and 17. In other words, they indicate the order of the magnetic domain from the reference position in which the magnetic sensors 16 and 17 currently exist.

After digitalization at the A/D converters 18 and 19, the sin $\theta$ and cos $\theta$ signals are multiplied at the multipliers 20 and 21 by the cos $\Phi$ and sin $\Phi$ signals outputted from the function generating ROM 25. Thus, sin $\theta \cdot$ cos $\Phi$ and cos $\theta \cdot$ sin $\Phi$ signals are outputted from the multipliers 20 and 21, respectively. On receipt of these signals, the reducer 22 passes a sin $(\theta - \Phi)$ signal to the comparator 23. Depending on the polarity of this signal, an up-count or down-count pulse is supplied to the counter 24. As a consequence, the count value $\Phi$ of the counter 24 increases for a positive sin $(\theta - \Phi)$ signal and decreases for a negative sin $(\theta - \Phi)$ signal. Because the sin $\Phi$ and cos $\Phi$ signals from the function generating ROM 25 changes depending on the count value $\Phi$, the system shown in FIG. 1 acts like a phase-locked loop in which sin $(\theta - \Phi)$ is rendered to be equal to 0, i.e. $\theta = \Phi$. From the foregoing, it is clear that the count value $\Phi$ at the counter 24 forms the lower bits of the absolute position data D-OUT and the lower bits indicate the current position of the magnetic sensors 16 and 17 in a particular magnetic domain on the magnetic scale 15.

Thus, the absolute position data D-OUT include higher bits for macroscopic indication and lower bits for microscopic indication, both of the instant position of the magnetic resistors 16 and 17 with the magnetic scale 15. With this composition, the absolute position data D-OUT is formed.

Figure 2:
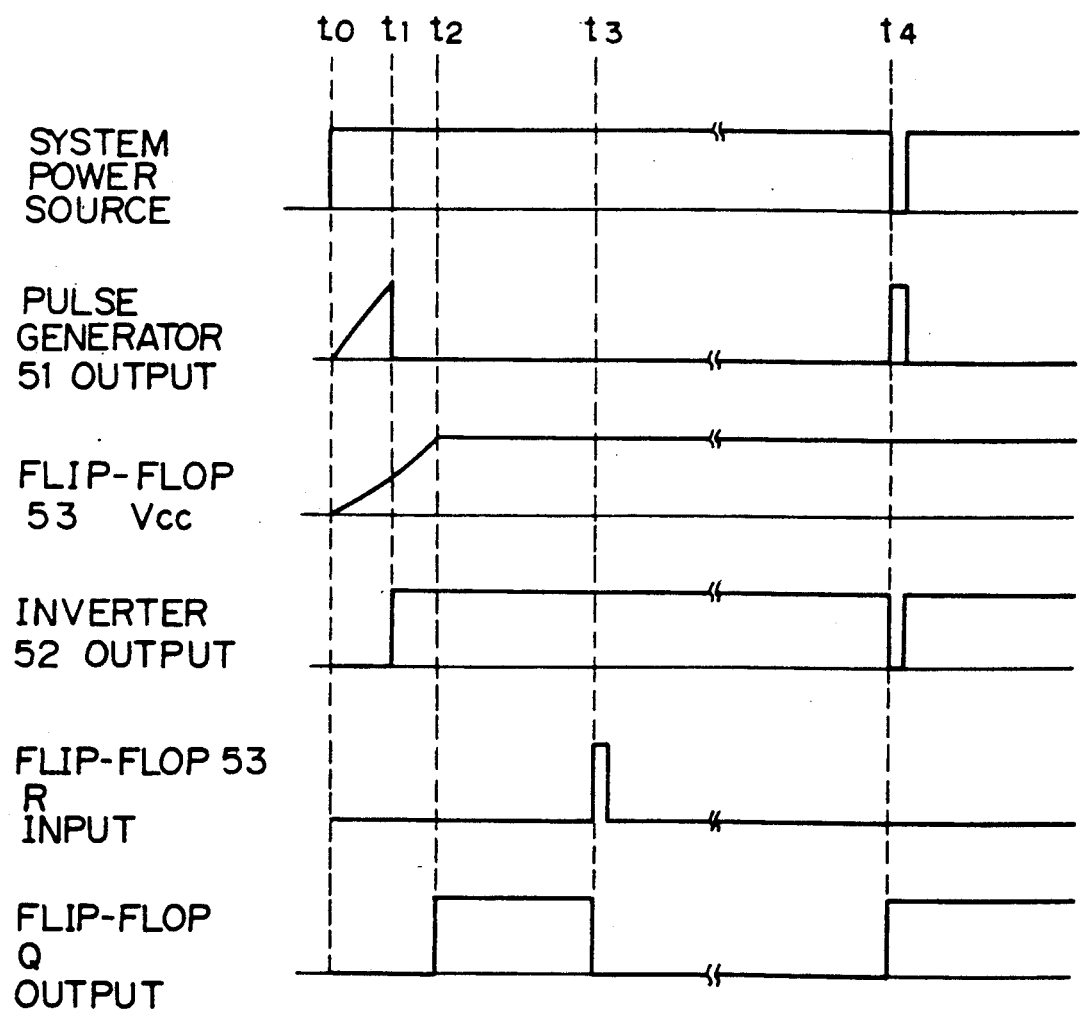
FIG. 2 is a timing chart of the signal processing by the rotary encoder shown in FIG. 1.

Operation of the power source monitor 40 is shown in FIG. 2.

The system power source is turned on at t0 and the output voltage of the pulse generator 51 rises linearly as shown in FIG. 2. After a certain period, the pulse generator 51 reaches a constant state at which its output signal falls down to an L-level at a time t1. Following this change, the output signal from the inverter 52 shifts from an L- to H-level. With the rising of voltage of the system power source, the capacitor $C_1$ is charged via the diode $D_1$ and, as a consequence, the power source voltage at the terminal Vcc of the flip-flop 53 rises gradually. This voltage reaches an H-level at time t2. At this moment, the flip-flop 53 is set and an H-level signal appears at its output terminal Q. In other words, the alarm signal AL assumes the H-level.

As a result, the polarity of the parity bit to be added to the absolute position data D-OUT is inverted at the parity checker 35 of the rotary encoder 10. After this moment, the absolute position data D-OUT from the rotary encoder 10 are all rendered invalid. Zero-point collimation of the rotary encoder 10 is practiced under this condition. When the zero-point collimation is completed at time t3, a zero-point signal Sz is issued by the detection head 44 and passed to the reset terminal R of the flip-flop 53 of the power source monitor 40 via the wave shaper 45. Thus, the flip-flop 53 is reset, and the alarm signal AL at the output terminal Q shifts to the L-level. This shift in level of the alarm signal AL cancels the polarity inversion of the parity bit at the parity checker 35 of the rotary encoder 10. As a consequence, the subsequent absolute position data D-OUT from the rotary encoder 10 are all rendered valid.

Assuming that power supply from the system power source is momentarily interrupted at time t4 under this condition, the pulse generator 51 of the power source monitor 40 issues a pulse signal instantly. At this moment, the voltage at the input terminal Vcc of the flip-flop 53 is held unchanged by function of the capacitor $C_1$. On receipt of the pulse signal, the flip-flop 53 is preset at the time t4 and the alarm signal AL at the output terminal Q resumes the H-level. As a result, the parity bit to be added is inverted again at the parity checker 35 of the rotary encoder 10. Thus, the subsequent absolute position data D-OUT from the rotary encoder 10 are all rendered invalid.

In accordance with the present invention, a momentary interruption in power supply to the rotary encoder is instantly detected by the pulse generator 51 and, in response to this detection, the mode of parity bit addition is inverted to invalidate all subsequent absolute position data the rotary encoder by action of the flip-flop 53 which issues an alarm signal AL at the very moment of the power source interruption.

What is claimed is:

1. A power source monitor for a rotary encoder including a parity checker and a zero-point detection head, said rotary encoder being effective for issuing absolute position data, said power source monitor comprising:
   a pulse generator connected to a power source for said rotary encoder and effective for generating a pulse signal when an input voltage thereof falls below a predescribed level;
   a flip-flop having a preset terminal connected to said pulse generator and a reset terminal connected to the zero-point detection head of said rotary encoder, said flip-flop being preset on receipt of said pulse signal for generation of an alarm signal to be supplied to said parity checker, and being reset on receipt of a zero-point signal for cancelling said alarm signal; and
   a capacitor connected to said power source and to said flip-flop to supply a constant input voltage to said flip-flop upon the occurrence of an interruption in power supplied by said power source.

2. A power source monitor as claimed in claim 1 in which
   said alarm signal produces an inversion in polarity of a parity bit to be added to said absolute position data at said parity checker so that subsequent absolute position data are rendered invalid.

3. A power source monitor and a rotary encoder combination, said combination comprising:
   a rotary encoder including a parity checker and a zero-point detection head, said rotary encoder being effective for issuing absolute position data;
   a power source monitor comprising:
   a pulse generator connected to a power source for said rotary encoder and effective for generating a pulse signal when an input voltage thereof falls below a predescribed level;
   a flip-flop having a preset terminal connected to said pulse generator and a reset terminal connected to the zero-point detection head of said rotary encoder, said flip-flop being preset on receipt of said pulse signal for generation of an alarm signal to be supplied to said parity checker, and being reset on receipt of a zero-point signal for cancelling said alarm signal; and
   a capacitor connected to said power source and to said flip-flop to supply a constant input voltage to said flip-flop upon the occurrence of an interruption in power supplied by said power source.

4. The combination of claim 3 in which said alarm signal produces an inversion in polarity of a parity bit to be added to said absolute position data at said parity checker so that subsequent absolute position data are rendered invalid.

* * * * *